United States Patent
Chen et al.

(10) Patent No.: US 9,274,543 B2
(45) Date of Patent: Mar. 1, 2016

(54) ESTIMATION APPARATUS AND METHOD FOR ESTIMATING CLOCK SKEW

(75) Inventors: Ying-Yen Chen, Chiayi County (TW); Jih-Nung Lee, Hsinchu County (TW)

(73) Assignee: Realtek Semiconductor Corp., Science Park, HsinChu (TW)

(*) Notice: Subject to any disclaimer, the term of this patent is extended or adjusted under 35 U.S.C. 154(b) by 638 days.

(21) Appl. No.: 13/609,287

(22) Filed: Sep. 11, 2012

(65) Prior Publication Data

US 2013/0282318 A1    Oct. 24, 2013

(30) Foreign Application Priority Data

Apr. 20, 2012 (TW) .............. 101114189 A

(51) Int. Cl.
*G06F 1/10* (2006.01)
*G01R 31/3185* (2006.01)

(52) U.S. Cl.
CPC .......... *G06F 1/10* (2013.01); *G01R 31/318594* (2013.01)

(58) Field of Classification Search
CPC .......... G06F 1/0321; G06F 1/04; G06F 1/06; G06F 1/08; G06F 1/10; G06F 1/12; G06F 19/00; G01R 31/318552; G01R 31/318594; H03K 5/13; H03K 5/133–5/135; H03K 5/14
USPC ........................................... 702/79
See application file for complete search history.

(56) References Cited

U.S. PATENT DOCUMENTS

| 2008/0115004 A1* | 5/2008 | Braun et al. .............. 713/401 |
| 2008/0129344 A1 | 6/2008 | Yen et al. |
| 2010/0090738 A1* | 4/2010 | Changchein et al. ......... 327/170 |
| 2011/0012683 A1 | 1/2011 | Lin |

FOREIGN PATENT DOCUMENTS

| TW | 200905210 | 2/2009 |
| TW | 201001121 | 1/2010 |
| TW | 201023518 | 6/2010 |
| TW | I333073 | 11/2010 |

\* cited by examiner

*Primary Examiner* — Toan Le
(74) *Attorney, Agent, or Firm* — Winston Hsu; Scott Margo

(57) ABSTRACT

A method for estimating a clock skew between a first clock and a second clock. The method includes the steps of detecting the clock skew to generate a detection resultant signal representing the clock skew; and determining time unit of a signal processing process, and estimating the clock skew according to the time unit of the signal processing process and the detection resultant signal.

14 Claims, 6 Drawing Sheets

ESTIMATION APPARATUS AND METHOD FOR ESTIMATING CLOCK SKEW

BACKGROUND OF THE INVENTION

1. Field of the Invention

The present invention relates to a clock skew estimation mechanism, and more particularly, to a method and estimation apparatus for estimating the clock skew between two clocks.

2. Description of the Prior Art

Process variations greatly impact yield rate in semiconductor processes when advanced to the deep sub-micron stage. The process variation not only affects the transmitting time of the data signal, but also the clock skew variation of the clock in the chip during a worst case scenario. Based on the fact that the synchronization circuit synchronizes the data according to the clock of the chip, the work timing of the circuit will be affected seriously if the clock of chip shifts forward and backward because of the process variation. The conventional solution is to increase the strength of work timing to decrease the timing error generated from the work timing drift. However, if the strength of work timing is set larger than needed in the design stage, circuit area and design would be wasted.

SUMMARY OF THE INVENTION

Therefore, one of the objectives of the invention is to provide an estimation apparatus and method used to estimate the clock skew between a first clock and a second clock, to solve the problems mentioned above.

In the following embodiments of the present invention, in order to more precisely understand the work timing drift due to the semiconductor process, a built-in sensing circuit is added to the chip (i.e., an integrated circuit) to detect the variation of the characteristic of the circuit devices caused by the process variation and voltage drop variation, and to further detect and estimate the clock skew.

In practice, the apparatus proposed by the embodiment of the present invention is capable of measuring the timing skew variation and detecting work timing skew variation resulting from the present process and the routing rules of the circuit design, for accurately dealing with the setting of the parameters of the process design in the future.

According to an embodiment of the present invention, an estimation apparatus for estimating the clock skew between the first clock and the second clock is disclosed. The estimation apparatus includes a detecting circuit and a processing circuit. The detecting circuit is arranged for detecting the clock skew between the first clock and the second clock, to generate the detection resultant signal representative of the clock skew. The processing circuit is coupled to the detecting circuit and arranged for determining the time unit of signal processing, and estimating the clock skew according to the time unit of signal processing and detection resultant signal. Besides, based on the mentioned embodiment of the present invention, a method for estimating the clock skew between the first clock and the second clock is disclosed. The method includes: detecting the clock skew between the first clock and the second clock, to generate the detection resultant signal representative of the clock skew; determining the time unit of signal processing, and estimating the clock skew according to the time unit of signal processing and detection resultant signal.

According to another embodiment of the present invention, where a method for estimating the clock skew between the first clock and the second clock is disclosed. The first clock is generated from a frequency synthesizer and forwarded to the first circuit, and the second clock is generated from the frequency synthesizer and forwarded to the second circuit. The method includes: receiving the first clock and the second clock generated from the frequency synthesizer and forwarded by the second circuit at the first circuit; detecting the first clock skew between the first clock received by the frequency synthesizer and the second clock forwarded by the second circuit, to generate the first detection resultant signal representative of the first clock; estimating the first clock skew according to the time unit of signal processing and the first detection resultant signal; receiving the second clock and the first clock generated from the frequency synthesizer and forwarded by the first circuit; detecting the second clock skew between the second clock generated from the frequency synthesizer and the first clock forwarded by the first circuit, to generate the second detection resultant signal representative of the second clock skew; estimating the second clock skew according to the time unit of signal processing and the second detection resultant signal; and calculating the clock skew between the first clock and the second clock according to the estimated first and second clock skews.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
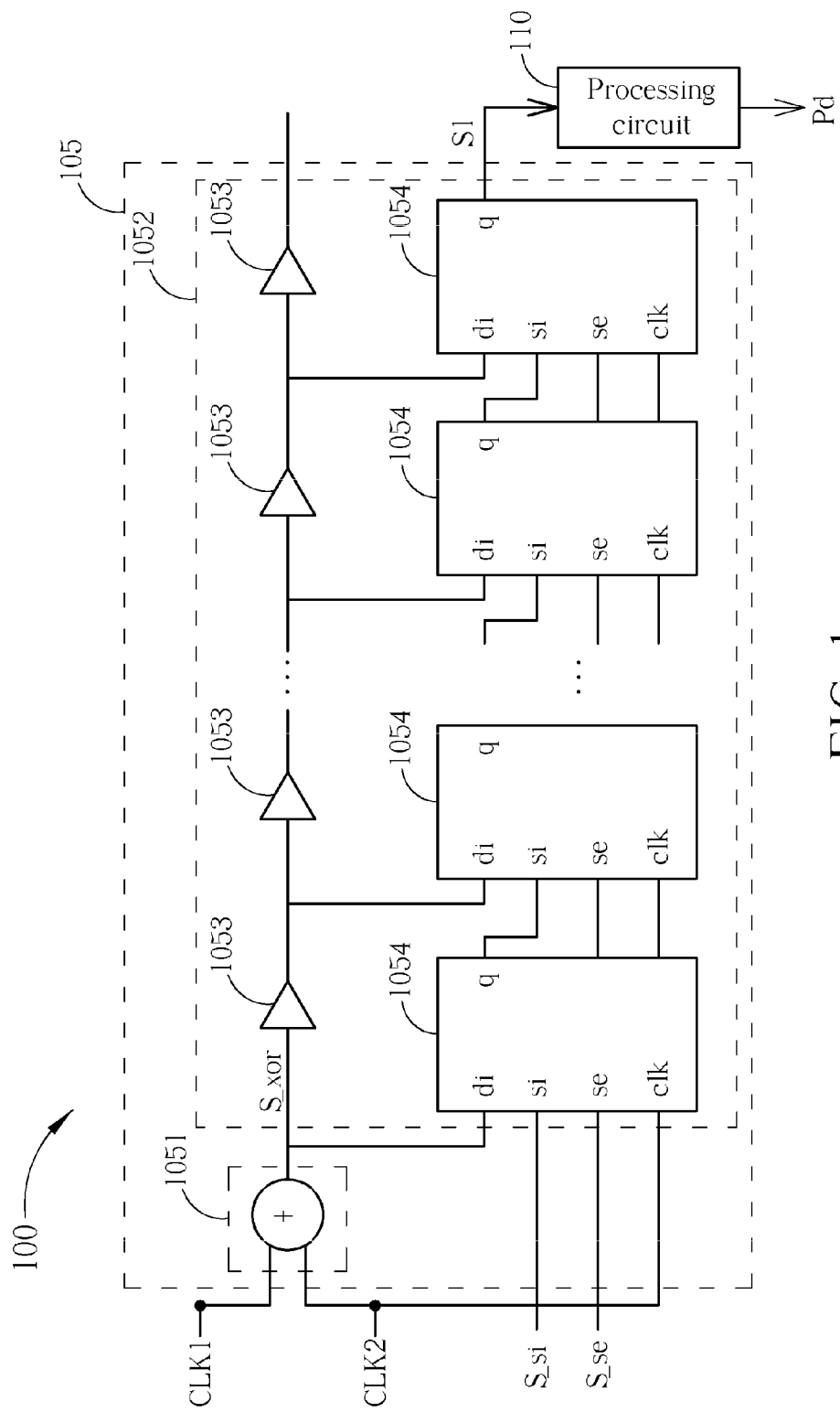
FIG. 1 is a diagram illustrating an estimation apparatus for estimating the clock skew between a first clock and a second clock.
Figure 2:
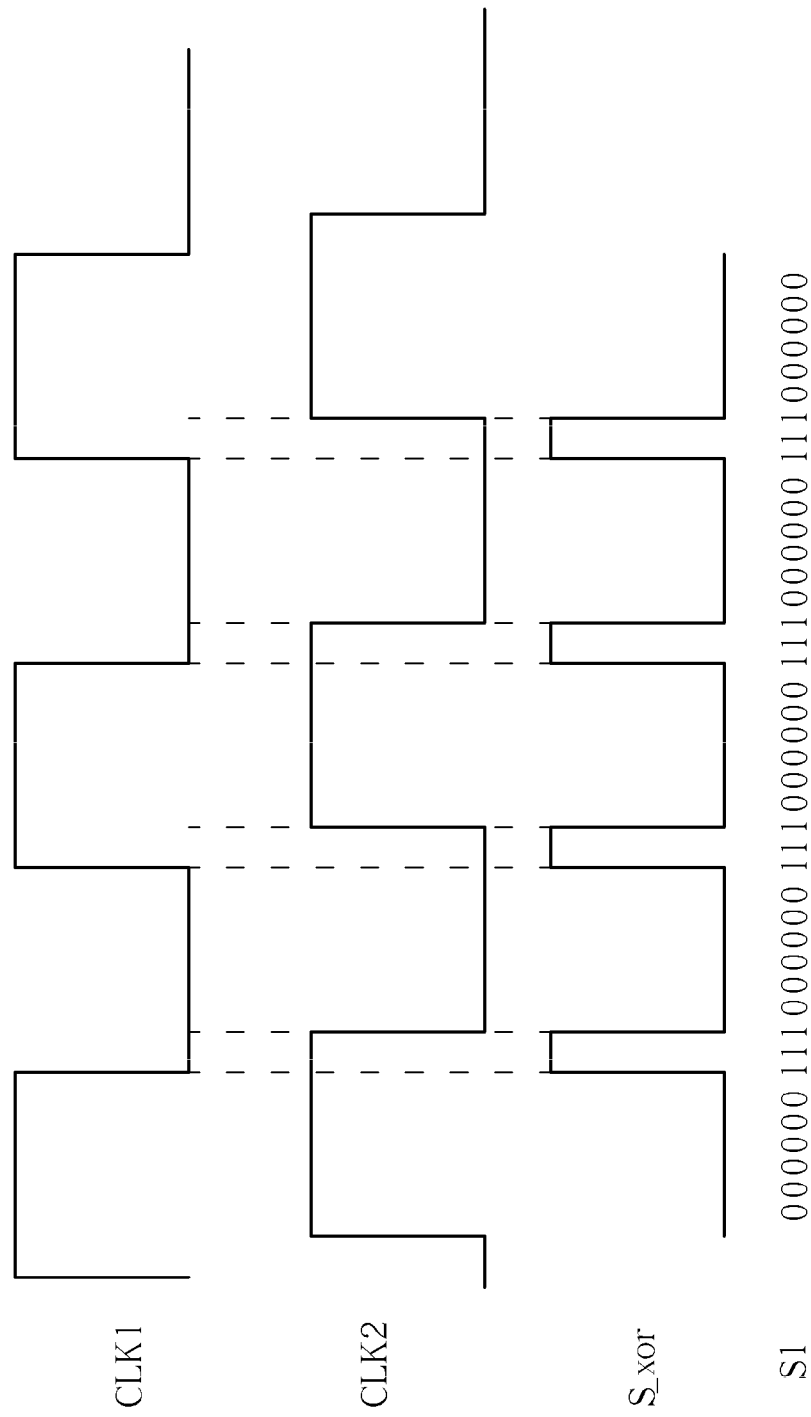
FIG. 2 is a diagram illustrating exemplary signals generated from the estimation apparatus shown in FIG. 1.

Please refer to FIG. 1 and FIG. 2. FIG. 1 is a diagram illustrating an embodiment of an estimation apparatus 100 for estimating the clock skew between a first clock CLK1 and a second clock CLK2. FIG. 2 is a diagram illustrating exemplary signals associated with the clock skew estimated by the estimation apparatus 100 shown in FIG. 1. As shown in FIG. 1, the estimation apparatus 100 includes a detecting circuit 105 and a processing circuit 110. The detecting circuit 105 includes a comparing circuit 1051 and a buffering and latching circuit 1052. The comparing circuit 1051 includes an XOR gate. The buffering and latching circuit 1052 includes a plurality of buffers 1053 and a plurality of flip-flops 1054. With regard to the interconnection of signals, the first clock CLK1 and the second clock CLK2 are connected to the input of the XOR gate, and the output of the XOR gate is connected to the buffers 1053 and the flip-flops 1054, such that the comparison resultant signal S_xor at the output of the XOR gate is transmitted to the buffers 1053 and the flip-flops 1054, wherein the buffers 1053 are electrically connected in series for buffering and transmitting the logic level values of the comparison resultant signal S_xor at different time points sequentially; and the flip-flops 1054 are electrically connected in series, and coupled to the input nodes of the buffers 1053, respectively. The flip-flop in this embodiment can be implemented with scan D-type flip-flops (Scan DFF), where the data input node di thereof is connected to the signal input of a corresponding buffer, the clock input node clk thereof is connected to one of the first clock CLK1 and the second clock CLK2 (in this embodiment, the clock input node clk is connected to the second clock CLK2), the shift input node si thereof is connected to the data output node q of the previous flip-flop or connected to a shift signal S_si, and the shift enabling node se thereof is connected to a shift enabling signal S_se. Besides, the last flip-flop generates and outputs the detection resultant signal S1 to the processing circuit 110. The flip-flops 1054 acquire the data respectively stored in the corresponding buffers according to the frequency of the second clock CLK2 received at the clock input node clk, and generate the detection resultant signal S1. Therefore, by means of the operation of the XOR gate, buffers, and Scan DFFs, the detecting circuit 105 may be used to detect the clock skew Pd between the first clock CLK1 and the second clock CLK2, and accordingly generate the detection resultant signal S1 representative of the clock skew Pd.

In this embodiment, the first clock CLK1 and the second clock CLK2 are clock signals generated from the same frequency synthesizer and clock skew between the first CLK1 and the second clock CLK2 is often present due to the circuit layout. Therefore, in this embodiment, it is assumed that the first clock CLK1 and the second clock CLK2 have substantially the same frequency but different phases. However, it should be noticed that this is for illustrative purposes only, and is not meant to be a limitation of the present invention. As shown in FIG. 2, the first clock CLK1 and the second clock CLK2 are signals with the same frequency but different phases. The comparing circuit 1051 is used for comparing the waveforms of the first clock CLK1 and the second clock CLK2, where the XOR gate receives the first clock CLK1 and the second clock CLK2, and performs an XOR operation upon the received first clock CLK1 and second clock CLK2 to generate the comparison resultant signal S_xor. When the logic levels of the first clock CLK1 and the second clock CLK2 are equal to each other, the output of the XOR gate is logic low level '0'. On the other hand, when the logic levels of the first clock CLK1 and the second clock CLK2 are different from each other, the output of the XOR gate is logic high level '1'. Hence, as shown in FIG. 2, the signal length of the high logic level '1' of the comparison resultant signal S_xor outputted from the XOR gate may represent the clock skew Pd between the first clock CLK1 and the second clock CLK2. It should be noticed that the signal length of the high logic level '1' is not estimated at this moment, and neither is the clock skew Pd. In this embodiment of the present invention, the estimation apparatus 100 estimates the clock skew Pd by the digital calculation of the subsequent buffering and latching circuit 1052 and processing circuit 110. The estimation apparatus 100 uses the digital estimation to obtain/sample the number of time units (for example, the operating time of the transistor unit) corresponding to the signal length of clock skew Pd represented by the comparison resultant S_xor. In the practice of this embodiment, which is not meant to be a limitation of the invention, the operating time of transistor unit is a gate propagation delay of a buffer.

The buffering and latching circuit 1052 is used for buffering/latching the comparison resultant signal S_xor, and generating the detection resultant signal S1 to represent clock skew Pd according to the first clock CLK1, the second clock CLK2, and/or the comparison resultant signal S_xor, wherein the detection resultant signal S1 is a digital data signal having the estimation information of the number of time units corresponding to the clock skew Pd. It should be noticed that, in this embodiment, the buffering and latching circuit 1052 generates the detection resultant signal S1 according to the frequency of the second clock CLK2. Since the first clock signal CLK1 and the second clock CLK2 have the same frequency, the buffering and latching circuit 1052 in other embodiments may generate the detection resultant signal S1 according to the frequency of the first clock CLK1. After the detection resultant signal S1 is generated, the processing circuit 110 may estimate the clock skew Pd according to the number of time units, which corresponds to the clock skew Pd (intrinsically included in the detection resultant signal S1 and the actual time length of one time unit). The time length of one time unit of signal processing may be estimated/determined by the processing circuit 110 in advance or determined after the detection resultant signal S1 is obtained.

When the XOR gate generates and outputs the comparison resultant signal S_xor, the aforementioned buffers 1053 are used to buffer the signal content of the comparison resultant signal S_xor one after the other. The clock input of each corresponding Scan DFF is coupled to the second clock CLK2. Hence, each Scan DFF operates according to the frequency of the second clock CLK2. By using N scan DFFs, the waveform of the comparison resultant signal S_xor, which represents the clock skew Pd between the two clocks, may be sampled in a signal period of the second clock CLK2 to generate N sampled values. Thus, after being sampled, the variation of the sampled values may indicate the value of the clock skew Pd. As shown in FIG. 2, the detection resultant signal S1 includes a series of data bits generated from sampling. For example, as shown in FIG. 2, a series of data bits of the detection resultant signal S1 in one signal period P_S1 has a series of data bits '1' and a series of data bits '0'. In this example, the number of data bits '1' is 3, which is smaller than the number of data bits '1'. Assuming that the response time of each flip-flop is substantially the same, the number of data bits '1' represents the time that the comparison resultant signal S_xor is at a high logic level in one signal period, that is, the value of the clock skew Pd between the first clock CLK1 and the second clock CLK2.

The series of data bits included in the detection resultant signal S1 are forwarded to the processing circuit 110. In order to obtain or calculate the value of the clock skew Pd, the processing circuit 110 calculates and estimates the time unit of each signal processing within the estimation apparatus 100, that is, the time unit of the signal processing of a basic circuit element (composed of transistors for a flip-flop) in the estimation apparatus 100. Equivalently, the processing circuit 110 may determine the aforementioned time unit of each signal processing by estimating the average time unit of signal processing of the transistors. After determining the time unit of signal processing, the processing circuit 110 estimates the clock skew Pd according to the determined time unit of signal processing and the detection resultant signal S1 generated by the detecting circuit 105. For example, as shown in FIG. 2, the detection resultant signal S1 contains 3 consecutive data bits represented by '1' in a signal period, which means that the value of the clock skew Pd corresponds to three times as large as the time unit of signal processing. Hence, after the time unit of signal processing is estimated and calculated, the processing circuit 110 is capable of determining the value of the clock skew Pd. In other words, the processing circuit 110 detects a set of data bits (for example, the aforementioned 3 consecutive data bits) that correspond to the clock skew Pd in the detection resultant signal S1 and determines the value of the time unit, which is used to estimate the clock skew Pd.

Moreover, in other embodiments, the processing circuit 110 can determine that the time period of first clock CLK1/second clock CLK2 has M1 time units of signal processing, and also determine that the set of data bits mentioned above corresponds to M2 time units of signal processing. Next, the processing circuit 110 can estimate the value of the clock skew Pd according to the values of M1 and M2. For example, the time unit of signal processing is a gate propagation delay of a buffer. In a case where the frequency and the period length of the second clock CLK2 are known beforehand, the processing circuit 110 may fetch the signal of the second clock CLK2 to analyze the gate propagation delay of the buffer. For example, the processing circuit 110 can calculate the number M1 of gate propagation delays to which the second clock CLK2 corresponds in one period length. As the period length is known, the gate propagation delay of the buffer can be calculated to thereby estimate the clock skew Pd.

Figure 3:
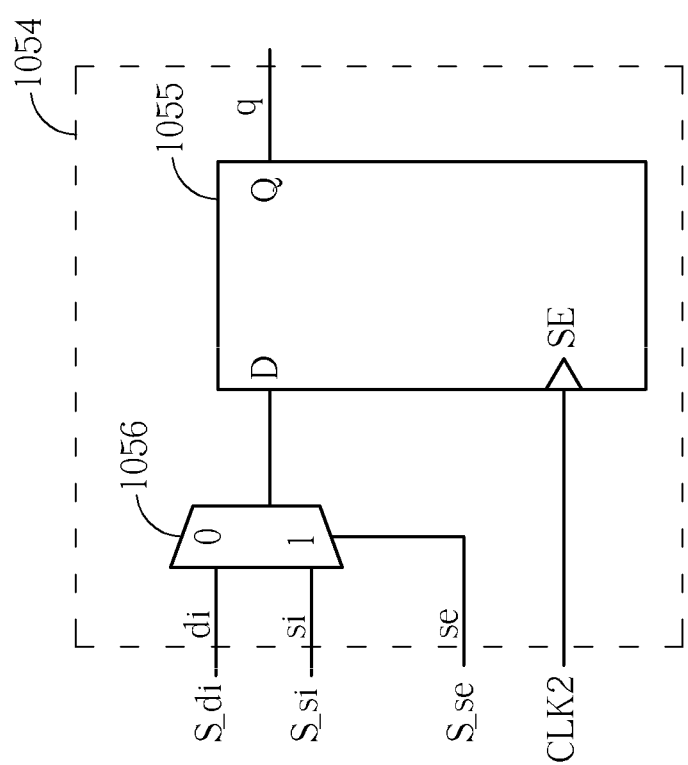
FIG. 3 is a circuit diagram of the Scan D-type flip-flop shown in FIG. 1.

The flip-flops 1054 used in the embodiment can be implemented with Scan DFFs. Two advantages and/or benefits may be simultaneously achieved by using Scan DFFs. For example, the two advantages and/or benefits may include buffering/latching the incoming comparison resultant signal S_xor and outputting the buffering/latching result to the following processing circuit 110. Referring to FIG. 3, which is a circuit diagram the Scan DFF shown in FIG. 1, each Scan DFF 1054 can be equivalently regarded as a circuit comprising a flip-flop 1055 and a multiplexer 1056, where the flip-flop 1055 receives the second clock CLK2 and the output of the multiplexer 1056 to generate the signal to the data output node of the Scan DFF flip-flop 1054, the multiplexer 1056 receives the comparison resultant signal S_xor at the input node of the buffer 1053 and the data of the previous scan DFF/data of an input signal data via the data input node di and the shift input node si of the Scan DFF 1054. For the convenience of description, the signals received at the data input node di and shift input node si are denoted by S_di and S_si in FIG. 3. The multiplexer 1056 selects an output signal S_di or S_si according to the shift enabling signal S_se received at the shift enabling node se of the Scan DFF 1054. When the shift enabling signal S_se is at the low logic level, the multiplexer 1056 may output the signal S_di (i.e., the comparison resultant signal S_xor) to the subsequent flip-flop 1055, and when the shift enabling signal S_se is at the high logic level, the multiplexer 1056 may output the signal S_si (i.e., the data of the previous Scan DFF or the data of the input signal) to the subsequent flip-flop 1055. In other words, when the shift enabling signal S_se is at the low logic level, the Scan DFF 1054 performs the latching operation on the comparison resultant signal S_xor to sample the content of the signal S_xor, and when the shift enabling signal S_se is at the high logic level, the Scan DFF 1054 outputs the sampled data to the processing circuit 110. It should be noticed that the present invention is not limited to using the Scan DFFs to implement the function of buffering/latching and the function of outputting the result of the buffering/latching. In other embodiments, the function and operation mentioned above may be implemented by a modified architecture of the circuit shown in FIG. 1. That is, the embodiment shown in FIG. 1 is merely the preferred embodiment, and is not a limitation to the present invention.

In addition, in the embodiment of the present invention, the number N of the Scan DFFs 1054 is the same as the number of the buffers 1053, and the value of N is a positive integer larger than or equal to 2. In practice, to precisely estimate the clock skew Pd, the number N of the Scan DFFs 1054 is related to the time period p of the second clock CLK2 and the time unit d of signal processing. The preferred embodiment of the present invention is to make the value of N larger than the value of p/d, so that the sampling operation of the buffering/latching mentioned above will be able to obtain enough data accurately. It should be noticed that, the number N of the Scan DFFs is not necessarily related to the value of p/d, and may be determined by the user or the designer. That is, the number N of the Scan DFFs is not a limitation of the present invention. For example, the number N of the Scan DFFs 1054 and the number N of the buffers 1053 may be determined by referring to the time unit d of signal processing and the length p of the time period of first clock CLK1/second clock CLK2. Besides, the operation of determining the value of N may be executed by the processing circuit 110.

In the preferred embodiment of the present invention, the aforementioned XOR gate and buffers are designed as symmetric cells. Regarding signals generated from the XOR gate and buffers designed using the symmetric cells, the rising time and the falling time thereof are either identical or similar to each other, thus avoiding the error and inaccuracy of estimating the clock skew Pd.

In actual applications, the estimation apparatus 100 in above embodiment may be disposed inside or outside the chip (i.e., the integrated circuit) to detect the clock skew Pd between the first clock CLK1 and the second clock CLK2. For example, the two clocks may both be generated from the same frequency synthesizer in the chip (i.e., the integrated circuit). However, due to the circuit layout inside the chip (i.e., the integrated circuit), the two clock passing through lines/traces of difference lengths would have a phase difference between them, resulting in the clock skew Pd. It should be noticed that the application mentioned above is for illustrative purposes only, and is not meant to be a limitation of the present invention.

Figure 4:
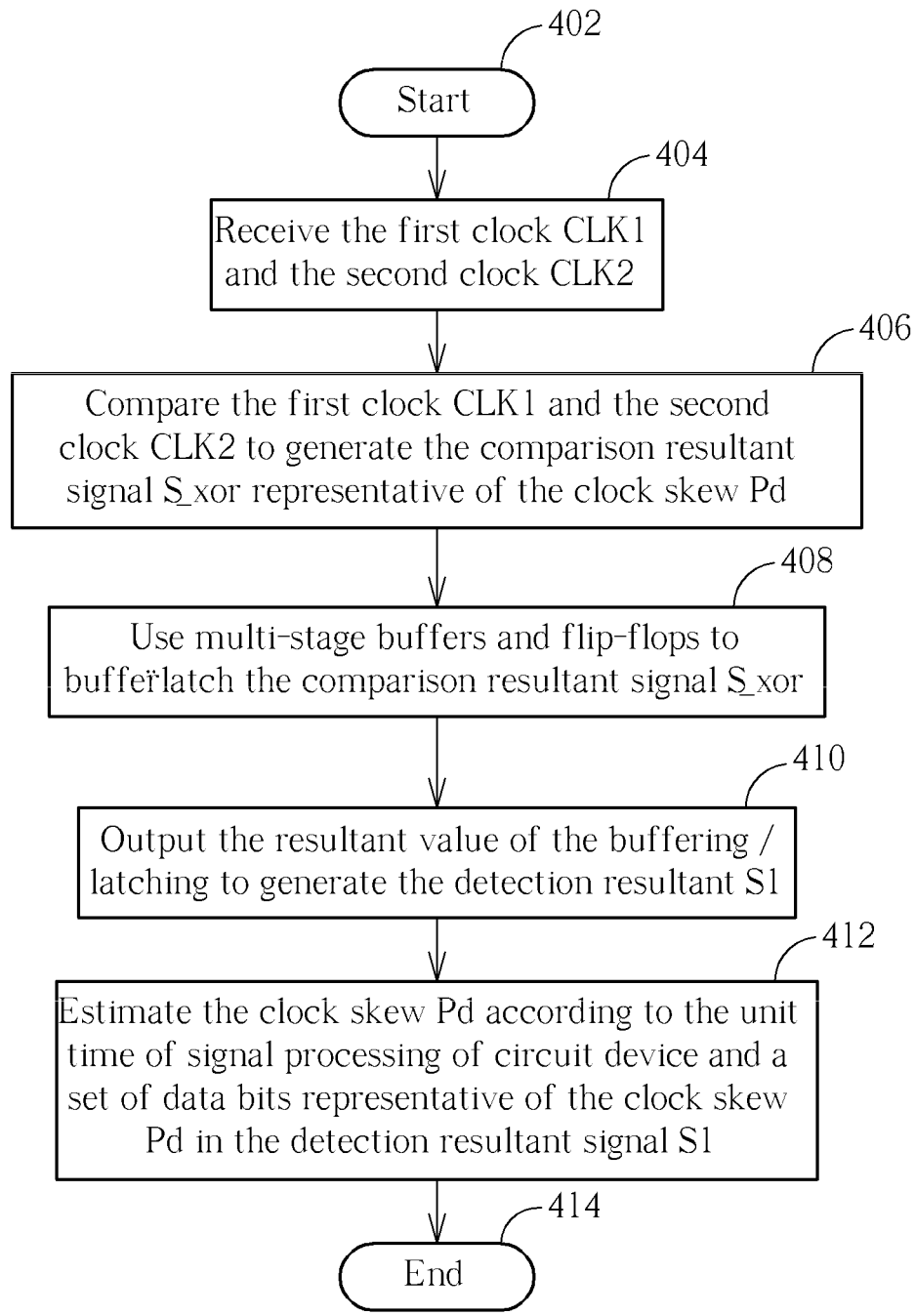
FIG. 4 is a flowchart illustrating the operation of the estimation apparatus shown in FIG. 1.

Please refer to FIG. 4, which illustrates the flowchart of the operation of the estimation apparatus 100 shown in FIG. 1. Please note that the steps are not required to be executed in exactly the same order shown in FIG. 4 and more steps may also be inserted into the illustrated steps. The steps of the flowchart are described in detail as follows:

Step 402: Start;

Step 404: Receive the first clock CLK1 and the second clock CLK2;

Step 406: Compare the first clock CLK1 and the second clock CLK2 to generate the comparison resultant signal S_xor representative of the clock skew Pd;

Step 408: Use multi-stage buffers and flip-flops to buffer/latch the comparison resultant signal S_xor;

Step 410: Output the resultant value of the buffering/latching to generate the detection resultant S1;

Step 412: Estimate the clock skew Pd according to the time unit of signal processing of circuit device and a set of data bits representative of the clock skew Pd in the detection resultant signal S1; and Step 414: End.

Figure 5:
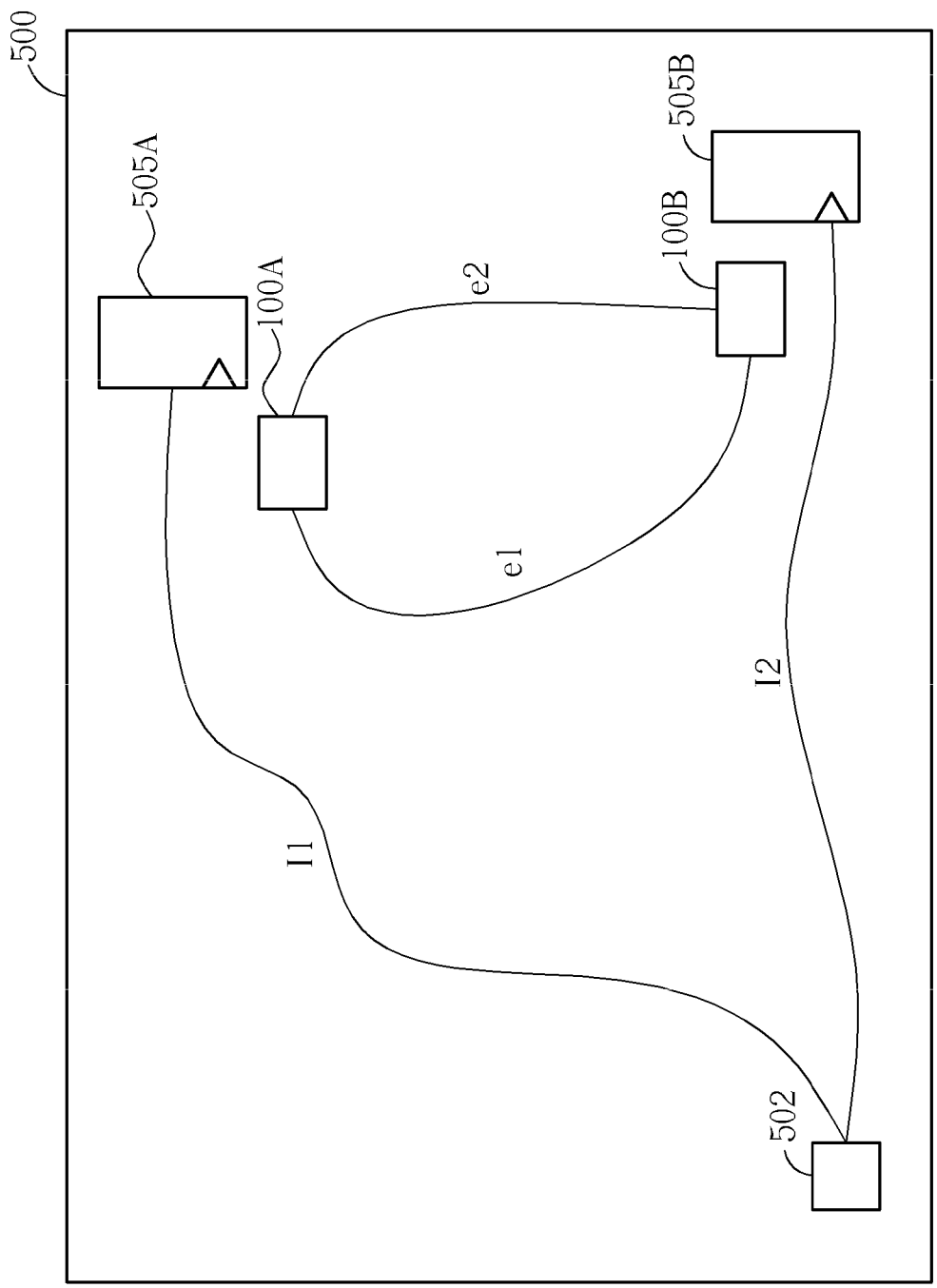
FIG. 5 is a diagram illustrating a layout of the integrated circuit having the estimation apparatus according to an embodiment of the present invention.

Besides, the estimation apparatus 100 shown in the embodiment of FIG. 1 is used to estimate the first clock CLK1 and the second clock CLK2 transmitted to the same position or similar positions in the circuit. However, in an actual application, the first clock CLK1 and the second clock CLK2 may be transmitted to different positions in the same integrated circuit. Referring to FIG. 5, which is a diagram of an embodiment illustrating a circuit layout of an integrated circuit 500, the integrated circuit 500 includes at least one frequency synthesizer (or at least one clock generator) 502, a plurality of D-type flip-flops 505A and 505B, and a plurality of estimation apparatuses 100A and 100B. Because the circuit positions of the D-type flip-flops 505A and 505B are different and far apart from each other, the flip-flop 505A in this embodiment may be regarded as a first part of the circuit, and the flip-flop 505B may be regarded as a second part of the circuit. The first clock CLK1 and the second clock CLK2 generated from the frequency synthesizer 502 are transmitted to different circuit positions (e.g., positions of the flip-flops 505A and 505B mentioned above) in the integrated circuit 500. Therefore, the first clock CLK1 and the second clock CLK2 are processed or transmitted via lines/traces with different lengths or different numbers of circuit devices, and have different phase delays. For example, the phase delay from the frequency synthesizer 502 to the flip-flop 505A is I1 and the phase delay from the frequency synthesizer 502 to the flip-flop 505B is I2, as shown in FIG. 5. The D-type flip-flops 505A and 505B are used to receive the first clock CLK1 and the second clock CLK2 to execute other signal processing processes, and the operation and function of the estimation apparatuses 100A and 100B are similar to that of the estimation apparatus 100 shown in FIG. 1. The estimation apparatuses 100A and 100B are positioned near the D-type flip-flops 505A and 505B, respectively, and are used to estimate the clock skew Pd between the first clock CLK1 and the second clock CLK2 after the first clock CLK1 and the second clock CLK2 undergo the phase delay. The estimation apparatuses 100A and 100B have an circuit interconnection between them (as shown in FIG. 5), such that the estimation apparatus 100A receives and estimates the first clock CLK1 at the input node of the D-type flip-flop 505A and the second clock forwarded by the estimation apparatus 100B. The second clock forwarded by the estimation apparatus 100B is processed by the additional circuit (e.g., the interconnection between the estimation apparatus 100A and the estimation apparatus 100B), and therefore has a different phase delay. For clarity, the second clock forwarded by the estimation apparatus 100B is denoted as CLK2', which is to be distinguished from the second clock CLK2 received at the input node of the D-type flip-flop 505B. In the same way, the estimation apparatus 100B is used to receive and estimate the second clock CLK2 at the input of the D-type flip-flop 505B and the first clock forwarded by the estimation apparatus 100A. For clarity, the first clock forwarded by the estimation apparatus 100A is denoted as CLK1', which is to be distinguished from the first clock CLK1 received at the input node of the D-type flip-flop 505A.

Therefore, the estimation apparatus 100A can be used to receive and estimate the clock skew D1 between the clock CLK1 and clock CLK2', and the estimation apparatus 100B can be used to receive and estimate the clock skew D2 between the clock CLK2 and clock CLK1'. Assuming that the signal phase delay from the frequency synthesizer 502 to the estimation apparatus 100A is I1, the signal phase delay from the frequency synthesizer 502 to the estimation apparatus 100B is I2, the signal phase delay from the estimation apparatus 100A to the estimation apparatus 100B is e1, and the signal phase delay from the estimation apparatus 100B to the estimation apparatus 100A is e2, the clock skew D1 is actually equal to I1−(I2+e2), and the clock skew D2 is actually equal to I2−(I1+e1). Hence, if the signal phase delays e1, e2 between the estimation apparatuses 100A and 100B are substantially the same or close to each other, the difference of the clock skews D1 and D2 can be expressed by the following equation:

$$D1-D2=2\times(I1-I2+e1-e2)=2\times(I1-I2).$$

Therefore, based on the fact that the clock skew Pd is the difference between the phase delays I1 and I2, the following equation can be used to get or estimate the clock skew Pd between the first clock CLK1 and the second clock CLK2:

$$Pd=I1-I2=(D1-D2)/2.$$

In this way, when the clock skews D1 and D2 are respectively estimated by the estimation apparatuses 100A and 100B, a clock skew can be obtained by subtracting the second clock skew D2 from the first clock skew D1, and then the clock skew Pd between the first clock CLK1 and the second clock CLK2 may be obtained by dividing the clock skew by two. Therefore, the estimating method demonstrated in the embodiment of the present invention may use the clock skews D1, D2 to calculate the clock skew Pd between the first clock CLK1 and the second clock CLK2, thus achieving the purpose of estimating the clock skew Pd.

Figure 6:
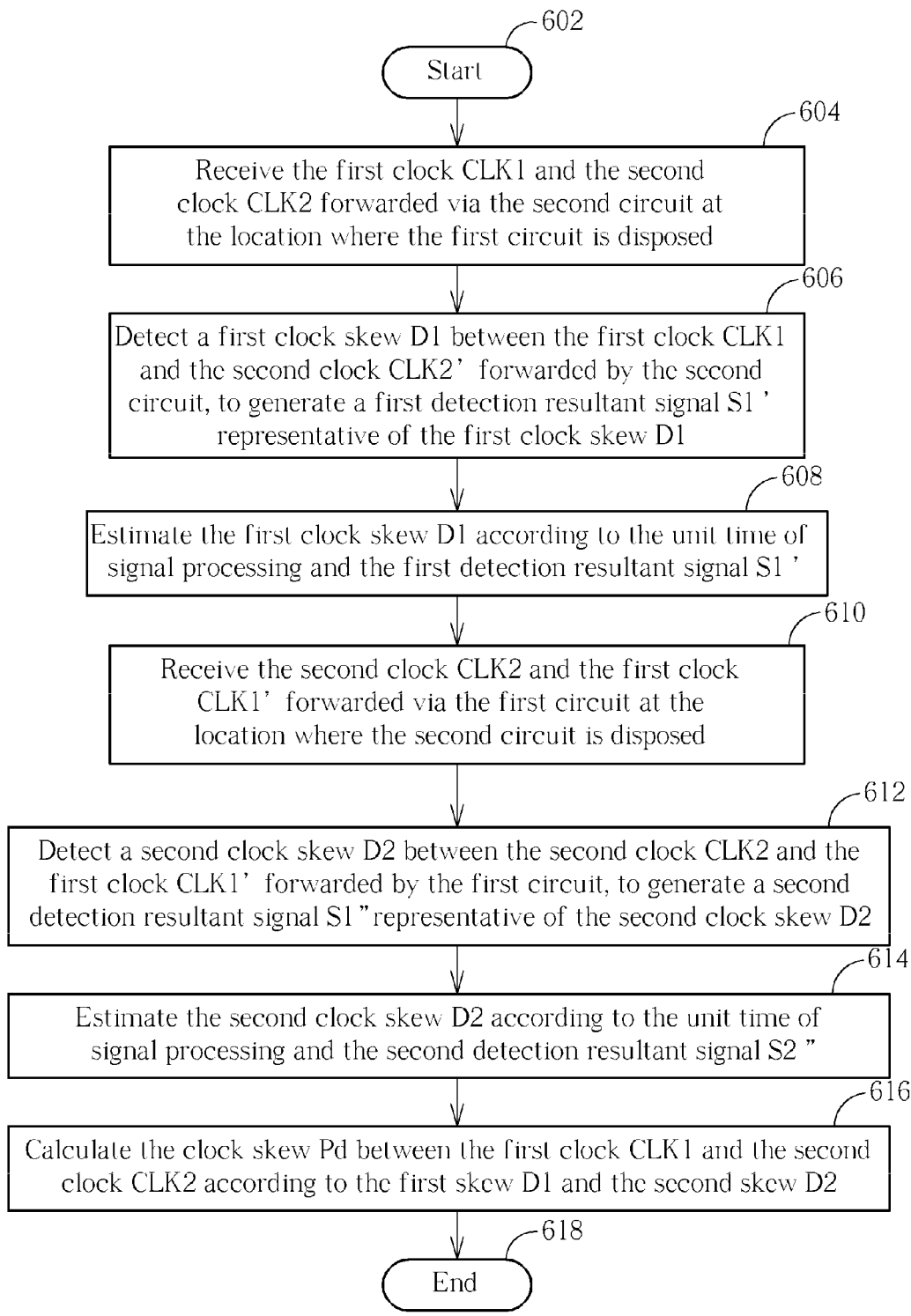
FIG. 6 is a flowchart illustrating the operation of the method of estimating the clock skew according to an embodiment of the present invention shown in FIG. 5.

Please refer to FIG. 6, which illustrates the flowchart of an embodiment of the operation of the method for estimating the clock skew shown in FIG. 5. The steps are not required to be executed in exactly the same order shown in FIG. 6 and more steps may be inserted into these steps. The details of the steps are described as follows:

Step 602: Start;

Step 604: Receive the second clock CLK2 generated from the frequency synthesizer 502 and forwarded via the second circuit (i.e., the D-type flip-flop 505B) at the location where the first circuit is disposed (i.e., the position of the D-type flip-flop 505A);

Step 606: Detect a first clock skew D1 between the first clock CLK1 received by the frequency synthesizer 502 and the second clock CLK2' forwarded by the second circuit (i.e., the D-type flip-flop 505B), to generate a first detection resultant signal S1' representative of the first clock skew D1;

Step 608: Estimate the first clock skew D1 according to the time unit of signal processing and the first detection resultant signal S1';

Step 610: Receive the second clock CLK2 and the first clock CLK1' generated from the frequency synthesizer 502 and forwarded via the first circuit (i.e., the D-type flip-flop 505A) at the location where the second circuit is disposed (i.e., the position of the D-type flip-flop 505B);

Step 612: Detect a second clock skew D2 between the second clock CLK2 received by the frequency synthesizer 502 and the first clock CLK1' forwarded by the first circuit (i.e., the D-type flip-flop 505A), to generate a second detection resultant signal S1" representative of the second clock skew D2;

Step 614: Estimate the second clock skew D2 according to the time unit of signal processing and the second detection resultant signal S2";

Step 616: Calculate the clock skew Pd between the first clock CLK1 and the second clock CLK2 according to the first skew D1 and the second skew D2; and Step 618: End.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An estimating device for estimating a clock skew between a first clock signal and a second clock signal, comprising:
   a detecting circuit, to generate a detection resultant signal corresponding to the clock skew between the first clock signal and the second clock signal;
   a processing circuit, coupled to the detecting circuit and arranged for determining a time unit of a signal processing process, and estimating the clock skew according to the time unit of the signal processing process and the detection resultant signal;
   wherein the processing circuit calculates a number of M1 time units to which the first clock or the second clock corresponds for a time period length associated with a frequency of the first clock or the second clock, receives the detection resultant signal and determines that a set of data bits in the detection resultant signal corresponds to M2 time units of the signal processing process, and estimates the clock skew according to values of M1 and M2.

2. The estimating device of claim 1, wherein the time unit of signal processing is one time unit of the signal processing process of a transistor.

3. The estimating device of claim 1, wherein the detecting circuit comprises:
   a comparing circuit, arranged for comparing the signal waveform of the first clock signal with the signal waveform of the second clock signal, to generate a comparison resultant signal; and
   a buffering and latching circuit, arranged for buffering and latching the comparison resultant signal, and generating the detection resultant signal according to the comparison resultant signal and at least the first clock signal or the second clock signal.

4. The estimating device of claim 3, wherein the comparing circuit comprises:
   an XOR gate, for generating the comparison resultant signal, wherein the comparison resultant signal is the XOR result of the first clock signal and the second clock signal and a high logic level of the comparison resultant signal represents the clock skew between the first clock signal and the second clock signal.

5. The estimating device of claim 3, wherein the buffering and latching circuit comprises:
   a plurality of buffers, coupled in series and arranged for receiving the generated comparison resultant signal sequentially; and
   a plurality of flip-flops, coupled in series and respectively coupled to input nodes of the buffers, the flip-flops arranged for referring to at least the first clock signal or the second clock signal to obtain data temporarily stored in the buffers, and generating the detection resultant signal accordingly.

6. The estimating device of claim 5, wherein the processing circuit is further arranged to determine the number of the buffers and the number of the flip-flops in the buffering and latching circuit according to the time unit of the signal processing process and a time period of the first clock signal or the second clock signal.

7. A method for estimating a clock skew between a first clock signal and a second clock signal, comprising:
   generating a detection resultant signal corresponding to the clock skew between the first clock signal and the second clock signal;
   determining a time unit of a signal processing process; and
   using a processing circuit to estimate the clock skew according to the time unit of the signal processing process and the detection resultant signal, the processing circuit is configured to:
      calculate a number of M1 time units to which the first clock or the second clock corresponds for a time period length associated with a frequency of the first clock or the second clock;
      receive the detection resultant signal and determine that a set of data bits in the detection resultant signal corresponds to M2 time units of the signal processing process; and
      estimate the clock skew according to values of M1 and M2.

8. The method of claim 7, wherein the time unit of the signal processing process is a time unit of the signal processing process of a transistor.

9. The method of claim 7, wherein the step of generating a detection resultant signal corresponding to the clock skew between the first clock signal and the second clock signal comprises:
   generating a comparison resultant signal by comparing the signal waveform of the first clock signal and the signal waveform of the second clock signal; and
   buffering and latching the comparison resultant signal, and generating the detection resultant signal according to the comparison resultant signal and at least the first clock signal or the second clock signal.

10. The method of claim 9, wherein the step of generating the comparison resultant signal comprises:
    generating the comparison resultant signal, wherein the comparison resultant signal is the XOR result of the first clock signal and the second clock signal and a high logic level of the comparison resultant signal represents the clock skew between the first clock signal and the second clock signal.

11. The method of claim 9, wherein the step of buffering and latching the comparison resultant signal and generating the detection resultant signal according to the detection resultant signal and at least the first clock signal or the second clock signal comprises:
    using a plurality of buffers coupled in series to receive the generated comparison resultant signal sequentially; and
    generating the detection resultant signal by respectively obtaining data temporarily stored in the buffers.

12. The method of claim 11, further comprising:
    determining the number of the buffers used according to the time unit of the signal processing process and a time period of the first clock signal or the second clock signal.

13. A method for estimating a clock skew between a first clock signal and a second clock signal, the first clock signal being generated from a frequency synthesizer and forwarded to a first circuit, the second clock signal being generated from the frequency synthesizer and forwarded to a second circuit, the method comprising:
    transmitting to the first circuit the first clock signal and the second clock signal from the frequency synthesizer and the second clock signal from the second circuit;
    detecting a first clock skew between the first clock signal from the frequency synthesizer and the second clock signal from the second circuit to generate a first detection resultant signal;
    using a first estimation apparatus for estimating the first clock skew according to a time unit of the signal processing process and the first detection resultant signal;

transmitting to the second circuit the second clock signal and the first clock signal generated from the frequency synthesizer and the first clock signal from the first circuit;

detecting a second clock skew between the second clock signal from the frequency synthesizer and the first clock signal from the first circuit to generate a second detection resultant signal;

using a second estimation apparatus for estimating the second clock skew according to the time unit of the signal processing process and the second detection resultant signal; and using the first and second estimation apparatuses for calculating the clock skew between the first clock signal and the second clock signal according to the estimated first clock skew and the estimated second clock skew.

14. The method of claim 13, wherein the step of calculating the clock skew between the first clock signal and the second clock signal comprises:

subtracting the second clock skew from the first clock skew, to get a clock skew difference; and dividing the clock skew difference by two, to get the clock skew between the first clock signal and the second clock signal.

* * * * *